US008908884B2

(12) United States Patent
Mantegna

(10) Patent No.: US 8,908,884 B2
(45) Date of Patent: Dec. 9, 2014

(54) SYSTEM AND METHOD FOR PROCESSING SIGNALS TO ENHANCE AUDIBILITY IN AN MRI ENVIRONMENT

(76) Inventor: John Mantegna, Burlington, VT (US)

( * ) Notice: Subject to any disclaimer, the term of this patent is extended or adjusted under 35 U.S.C. 154(b) by 894 days.

(21) Appl. No.: 13/097,107

(22) Filed: Apr. 29, 2011

(65) Prior Publication Data
US 2011/0268293 A1 Nov. 3, 2011

Related U.S. Application Data

(60) Provisional application No. 61/329,676, filed on Apr. 30, 2010.

(51) Int. Cl.
H03G 5/00 (2006.01)
H03G 3/32 (2006.01)
H03G 9/02 (2006.01)

(52) U.S. Cl.
CPC . *H03G 3/32* (2013.01); *H03G 9/025* (2013.01)
USPC .............. 381/103; 381/98; 381/104; 381/107

(58) Field of Classification Search
CPC ......... H03G 3/32; H03G 9/025; H03G 5/165; H03G 9/005; H03G 7/007; H03G 3/3005; H03G 5/005; H03G 3/3089; H03G 5/025; H03G 3/20; H03G 9/18; H04R 3/04; H04R 5/04; H04R 3/00; H04R 25/356
USPC ............. 381/103, 28, 98, 101, 102, 104, 106, 381/107, 120
See application file for complete search history.

(56) References Cited

U.S. PATENT DOCUMENTS 7,760,893 B1 * 7/2010 Felber ........................... 381/104
2011/0294453 A1 * 12/2011 Mishali et al. ................ 455/293

* cited by examiner

Primary Examiner — Paul S Kim
(74) Attorney, Agent, or Firm — K. P. Correll & Associates, LLC

(57) ABSTRACT

A system for processing signals to enhance patient audibility of a plurality of signals in an MRI environment is provided. The system includes an acoustic measuring device for measuring sound power levels generated by the MRI and a principal frequency component identifier for identifying principal frequencies measured by the acoustic measuring device. The system also includes an audio equalizer for controlling the amplitude and frequency of each of the plurality of signals in accordance with the principal frequencies. Further provided by the system is an attenuator for attenuating an overall sound level of the signals being processed and a dynamic range compression processor.

10 Claims, 3 Drawing Sheets

Flow Chart of Method for Performing the Invention

SYSTEM AND METHOD FOR PROCESSING SIGNALS TO ENHANCE AUDIBILITY IN AN MRI ENVIRONMENT

CROSS-REFERENCE TO RELATED APPLICATIONS

The present application is related to, claims the earliest available effective filing date(s) from (e.g., claims earliest available priority dates for other than provisional patent applications; claims benefits under 35. USC §119(e) for provisional patent applications), and incorporates by reference in its entirety all subject matter of the following listed application(s) (the "Related Applications") to the extent such subject matter is not inconsistent herewith; the present application also claims the earliest available effective filing date(s) from, and also incorporates by reference in its entirety all subject matter of any and all parent, grandparent, great-grandparent, etc. applications of the Related Application(s) to the extent such subject matter is not inconsistent herewith.

U.S. provisional patent application 61/329,676. entitled "System and Method for Preprocessing of Music to Enhance Audibility in an MRI Environment", naming John Mantegna, as inventor, filed 30. Apr. 2010.

BACKGROUND

1. Field of Use

This disclosure relates to preprocessing signals to enhance audibility in a magnetic resonance imaging (MRI) and fMRI systems; and in particular, relates to preprocessing musical signals through the exploitation of spectral masking in the human auditory system to enhance audibility.

2. Description of Prior Art (Background)

In Magnetic Resonance Imaging (MRI) devices, a patient lying in the bore of the main magnet is subjected to considerable noise levels that are created in the bore due to gradient switching, helium pump operation, ventilation equipment, etc. In order to protect the ears of the patient, circumaural headphones or earplugs are typically provided. Additionally, an operator of the MRI device may communicate with the patient via such headphones.

However, headphones do not provide sufficient attenuation of the ambient noise, and considerable noise reaches the patient's ears through tissue and bone conduction. Even with the best circumaural headphones, patients are subject to considerable noise levels, largely originating from the gradient coil system in the MRI device.

In addition, patients experience considerable discomfort (e.g., physical, psychological, emotional, etc.) when undergoing an MRI scan. For instance, the patient may be experiencing physical pain due to an illness, psychological or emotional pain or worry related to the illness, claustrophobia due to the cramped space within the bore of the MRI device, etc. The loud repetitive noise of the gradient coils can exacerbate these discomforts, increasing patient stress. Further, functional MRI (fMRI) related noise can be a serious impediment in the case of fMRI studies of the brains responses to stimuli; especially studies involving musical stimuli where audibility is critical.

Currently, widely-used methods attempt to reduce the maximum sound pressure level and do this by constructional sound deadening methods, for example, active phase cancellation; or, via a smaller gradient load. Another way is to reduce the sound pressure level at the ear, for example with headphones or ear plugs. Methods for sound extinction in the vicinity of the ear using interference are hardly ever implemented on account of the strong magnetic fields and the restricted space available. Headphones or earplugs also have only a very limited protective function since the loud knocking sounds can be transmitted not only via the auditory canal but also via the cranial bone into the inner ear and can thus simply thus not be filtered out just like that. Constructional sound deadening methods such as a heavier encapsulation of the coils and leads have only proved effective to a limited extent and reducing the sound by imposing less of a load on the gradient coils results in lower quality imaging.

In light of the above, it will be appreciated that there exists a need for masking noise generated by medical imaging devices such as MRI systems.

BRIEF SUMMARY

The foregoing and other problems are overcome, and other advantages are realized, in accordance with the presently preferred embodiments of these teachings. This invention analyzes and modifies acoustic signals, for example, music, to exploit spectral masking to enhance audibility of the music when heard in the context of MRI noise, while still preserving the integrity of the music.

In accordance with one embodiment of the present invention a system for processing signals to enhance patient audibility of a plurality of signals in an MRI environment is provided. The system includes an acoustic measuring device for measuring sound power levels generated by the MRI and a principal frequency component identifier for identifying principal frequencies measured by the acoustic measuring device. The system also includes an audio equalizer for controlling the amplitude and frequency of each of the plurality of signals in accordance with the at least one principal frequency.

In accordance with another embodiment of the present invention a system for processing signals to enhance user selected signal audibility in an MRI environment generating MRI audible pulses is provided. The system includes a signal dataset and program storage device readable by the system. The program storage device tangibly embodies a program of instructions executable by the system to modify the signal dataset by measuring an acoustic power spectrum associated with the at least one MRI audible pulse. The program of instructions also identifies principal frequency components associated with the MRI audible pulse and substantially matches the principal frequency components with corresponding signals within the signal dataset. The program of instructions further applies audio equalization to the substantially matched corresponding signals in accordance with the principal frequency components.

The invention is also directed towards a method for processing signals to enhance patient audibility of user selected musical signals in an MRI environment generating MRI pulse sequences. The method includes measuring an acoustic power spectrum of the MRI pulses and identifying within the acoustic power spectrum of the MRI pulses at least one principal frequency component and its magnitude. The method also includes applying parametric equalization to the user selected musical signals in accordance with the identified frequency component and its magnitude. In addition, the method attenuates an overall level of the parametrically equalized user selected musical signals and applies dynamic range compression to the parametrically equalized user selected musical signals. Lastly, the method includes applying audio gain to the parametrically equalized user selected musical signals.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
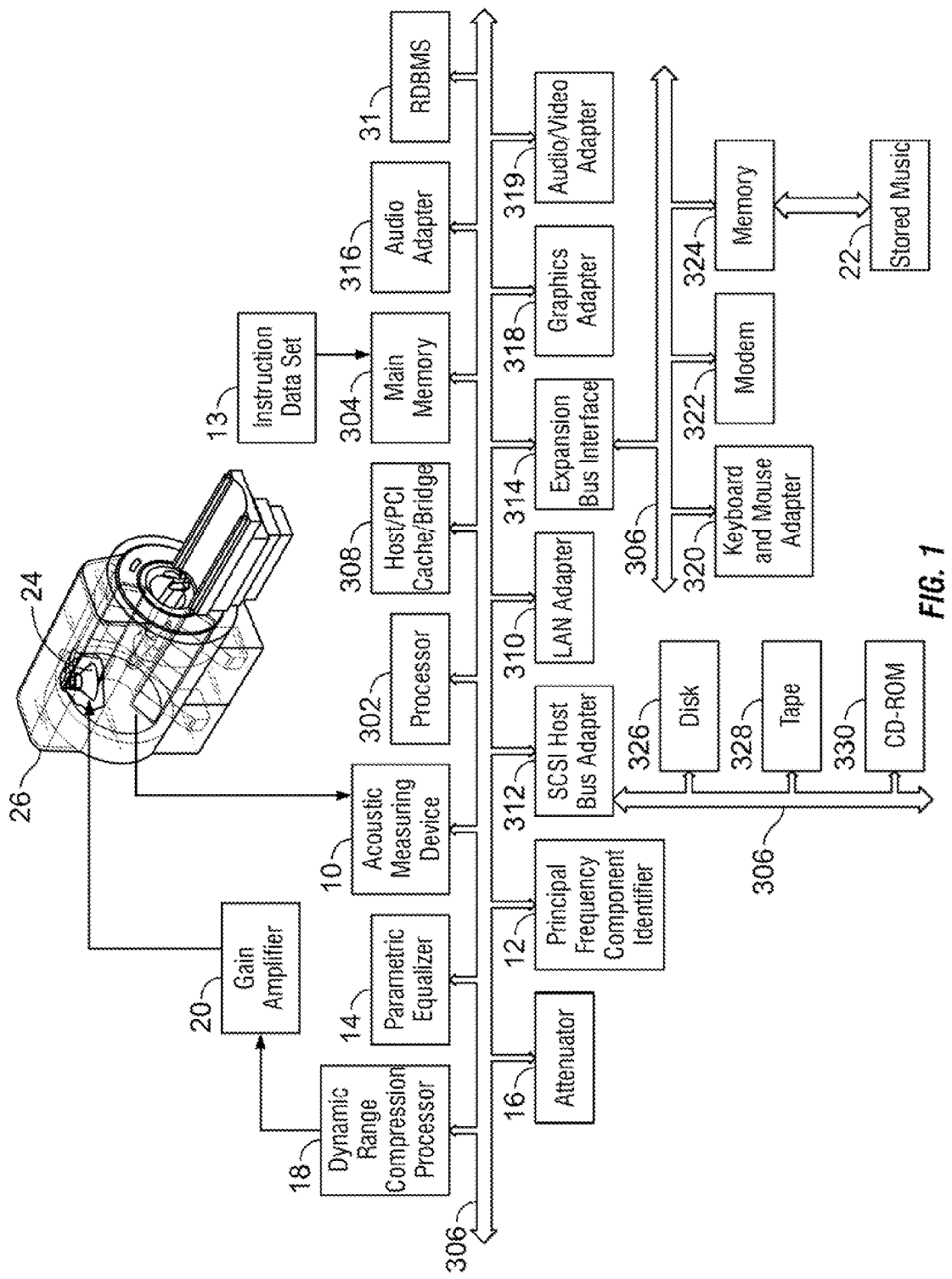
FIG. 1 is a schematic illustration of a system to enhance audibility in an MRI or fMRI environment in accordance with the present invention.

With reference now to FIG. 1, a block diagram illustrating a system 300 for spectrally masking MRI or fMRI gradient coil noise is depicted in which the present invention may be implemented. System 300 employs a peripheral component interconnect (PCI) local bus architecture. Although the depicted example employs a PCI bus, other bus architectures such as Accelerated Graphics Port (AGP) and Industry Standard Architecture (ISA) may be used. Processor 302 and main memory 304 are connected to PCI local bus 306 through PCI bridge 308. PCI bridge 308 also may include an integrated memory controller and cache memory for processor 302. Additional connections to PCI local bus 306 may be made through direct component interconnection or through add-in boards.

In the depicted example, local area network (LAN) adapter 310, SCSI host bus adapter 312, and expansion bus interface 314 are connected to PCI local bus 306 by direct component connection. It will be understood that LAN adapter 310 may also include an internet browser. In contrast, audio adapter 316, graphics adapter 318, and audio/video adapter 319 are connected to PCI local bus 306 by add-in boards inserted into expansion slots. Expansion bus interface 314 provides a connection for a keyboard and mouse adapter 320, modem 322, and additional memory 324. Small computer system interface (SCSI) host bus adapter 312 provides a connection for hard disk drive 326, tape drive 328, and CD-ROM drive 330. Typical PCI local bus implementations will support PCI expansion slots or add-in connectors.

An operating system runs on processor 302 and is used to coordinate and provide control of various components within data processing system 31. Data processing system 31 may be configured to process stored music 22 as described herein. The operating system may be any suitable commercially available operating system. In addition, an object oriented programming system such as Java may run in conjunction with the operating system and provide calls to the operating system from Java programs or applications executing on data processing system 300. "Java" is a trademark of Sun Microsystems, Inc. Instructions for the operating system, the object-oriented operating system, and applications or programs are located on storage devices, such as hard disk drive 326, and may be loaded into main memory 304 for execution by processor 302.

System 300 may be configured to process stored music as described herein in real time or store preprocessed music as described herein in memory 324. Similarly, music, preprocessed or otherwise, may be introduce to system 300 via CD-ROM 300, Tape 328, or Disk 326.

In some embodiments, such an adaptation may be incorporated within system 300. In particular, system 300 may include storage medium 324 with program instructions (see FIG. 2) executable by processor 302 to spectrally mask music stored in memory 324.

In general, input may be transmitted to system 300 to execute program instructions (see FIG. 2) within storage medium 324. Storage medium 324 may include any device for storing program instructions, such as a read-only memory, a random access memory, a magnetic or optical disk, or a magnetic tape. Program instructions (see FIG. 2) may include any instructions by which to perform the spectral masking processes described below.

Those of ordinary skill in the art will appreciate that the hardware in FIG. 1 may vary depending on the implementation. Other internal hardware or peripheral devices, such as flash read-only memory (ROM), equivalent nonvolatile memory, or optical disk drives and the like, may be used in addition to or in place of the hardware depicted in FIG. 1.

Still referring to FIG. 1, an acoustic measurement device 10 measures the power spectrum associated with the MRI pulse sequence being used. The measured power spectrum is used by the principal frequency component identifier 12 to identify one or more principal frequency components and their relative magnitudes. The number of principal frequency components identified can either be a number that is manually selected or automatically determined based on the acoustic power spectrum measurement. The number of principal components chosen may vary based on the properties of the power spectrum associated with a particular MRI pulse sequence.

Still referring to FIG. 1, acoustic measurement device 10 may be any suitable acoustic measuring device, such as, but not limited to: instantaneous sound level meter, an integrating sound level meter; or a data logging sound level meter. Similarly, acoustic measurement device 10 may be any device meeting international standards such as IEC 60651, IEC 60804. and ANSI S1.4. and graded as type (or class) 0-3.. In addition, acoustic measurement device also includes an analog-to-digital converter (ADC). The ADC may be any suitable ADC such as, but not limited to, 8-bit or 16-bit sampling, 11, 22, or 44 kHz sampling, and stereo or mono.

Figure 3:
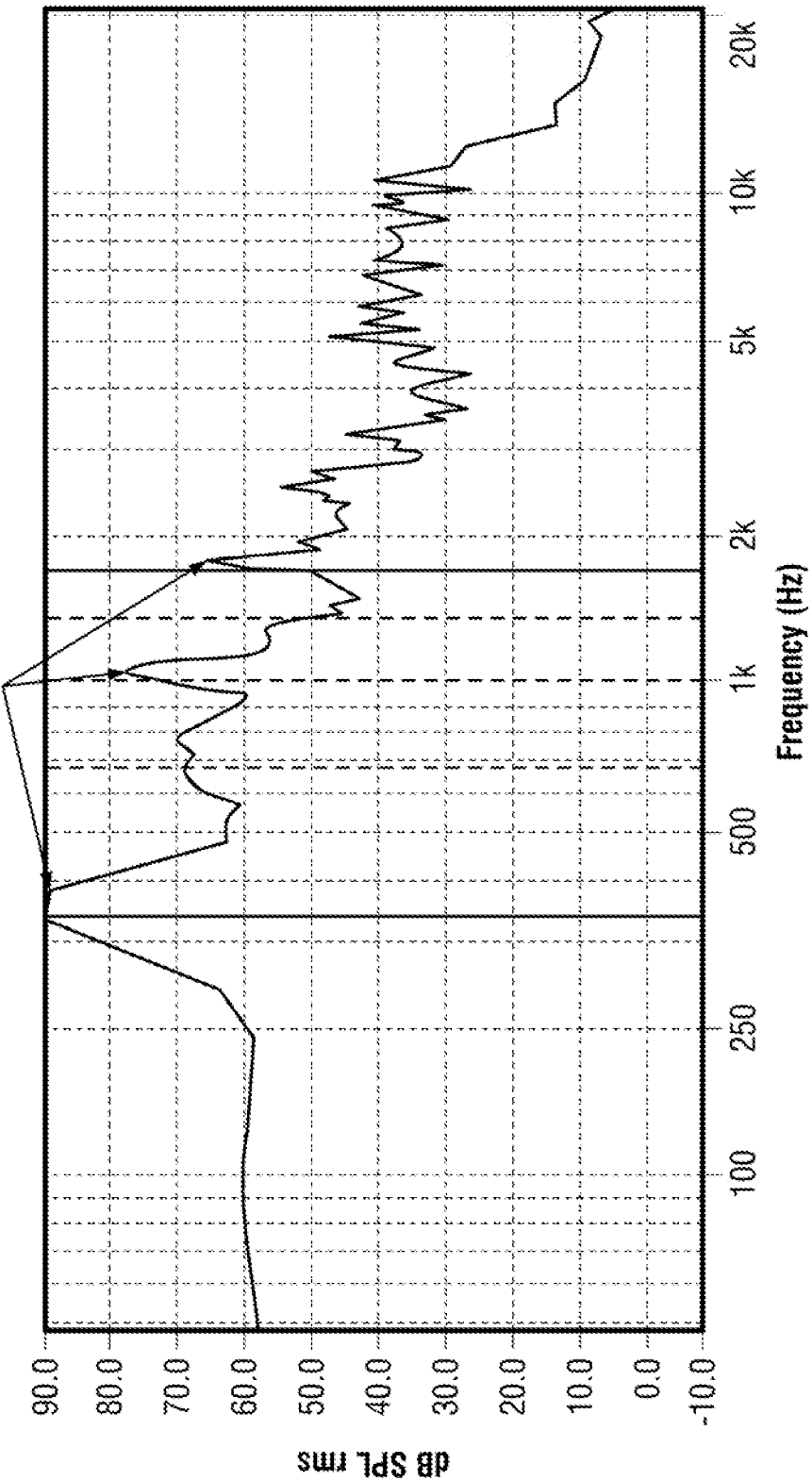
FIG. 3 is a graphical depiction of MRI gradient coil sound pressure levels versus frequency in accordance with the present invention shown in FIG. 1.

Principal frequency component identifier may be any suitable principal frequency component identifier. For example, the Fast Fourier Transform (FFT) or the Time-Based Fast Fourier Transform (TFFT) may be used to discern the desired principal frequency components exceeding one or more predetermined threshold levels. Referring to FIG. 3 there is shown a representative acoustic measurement of a MRI pulse sequence. For the sample power spectrum in FIG. 3, three principal frequency components generated by MRI gradient coils are identified for use in further processing; or in other words to be masked by music stored in memory 22. It will be understood that the number three is only an example, and that any suitable number of principal frequency components may be chosen.

Figure 2:
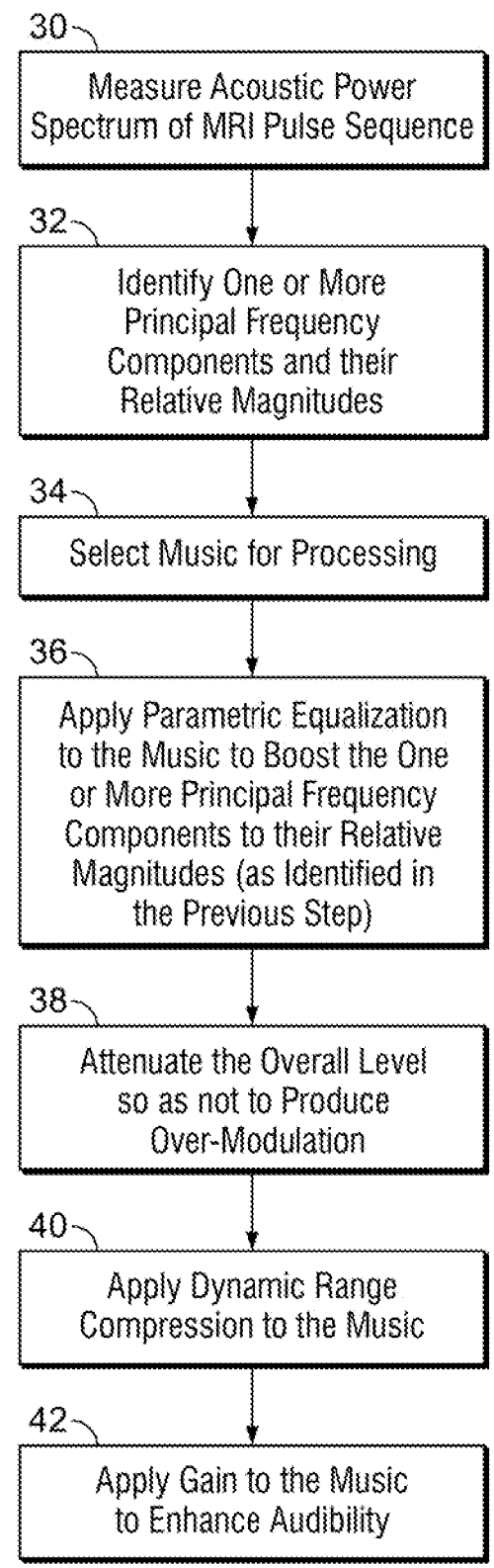
FIG. 2 is a method diagram for the spectrally masking MRI or fMRI noise in accordance with the present invention shown in FIGS. 1.

Referring also to FIG. 2 there is shown FIG. 2 a method diagram for the spectrally masking MRI or fMRI noise in accordance with the present invention shown in FIG. 1. The acoustic power spectrum of the MRI pulse is measured 30 by acoustic measuring device 10. Principal frequency component identifier 12 identifies 32 one or more principal frequency components. Music is selected for processing from stored music 22. It will be appreciated that stored music may be grouped or cataloged in accordance with: user preferences, MRI or fMRI gradient coil characteristics, or MRI or fMRI study objectives. Parametric equalizer 14 guided by the one or more principal frequency components identified in step 32 boosts or attenuates 36 comparable frequency components in the music selected for processing. Thus, for example, the comparable principal frequency components in the music selection are boosted in a manner analogous to the principal frequency components relative magnitudes in the MRI acoustic power spectrum, thus producing a processed or modified music selection. It will also be appreciated that parametric equalizer 14, controlled by a program of instructions, via processor 302, may modify stored music 22 in accordance with a psychoacoustic model which may include a patient's high frequency limit, threshold of hearing, and other acoustic parameters associated with human anatomy. While a parametric equalizer is preferred it will be understood that any suitable audio equalizer may be used. For example, in certain environments, a suitable graphic equalizer may be used to step 32 boosts or attenuates 36 comparable frequency components in the music selected for processing.

Attenuator 16 attenuates 38 the overall sound level of the modified music selection being processed so as not to produce over modulation. Dynamic range compression processor 18 applies 40 dynamic range compressions and amplifier 20 applies 42 appropriate gains to the modified music to further enhance audibility to patient via speaker 24. It will be understood that speaker 24 may be any suitable speaker, or headset, for operation in an MRI or fMRI environment. For example, but not limited to, speaker 24 may be non-magnetic circum-aural headphones, supra-aural headphones, or earbud headphones. Similarly, it is understood that dynamic range compression processor 18 may be any suitable dynamic range compressor for reducing the dynamic range of the modified music.

It will be appreciated that music or sound processed in the manner described above may be stored in memory 324 for later retrieval by RDBMS 31.

It should be understood that the foregoing description is only illustrative of the invention. Thus, various alternatives and modifications can be devised by those skilled in the art without departing from the invention. Accordingly, the present invention is intended to embrace all such alternatives, modifications and variances that fall within the scope of the appended claims.

What is claimed is:

1. A system for processing signals to enhance user selected signal audibility in an MRI environment generating at least one MRI audible pulse, the system comprising:
   at least one signal dataset, the at least one signal dataset comprising a plurality of signals;
   a program storage device readable by the system, wherein the program storage device tangibly embodies a program of instructions executable by the system to modify the at least one signal dataset, wherein modifying the at least one signal dataset comprises:
      measuring an acoustic power spectrum associated with the at least one MRI audible pulse;
      identifying at least one principal frequency component associated with the at least one MRI audible pulse exceeding a predetermined acoustic power level;
      substantially matching the at least one principal frequency component associated with the at least one MRI audible pulse exceeding a predetermined acoustic power level with at least one of the plurality of signals; and
      applying audio equalization to the at least one of the plurality of signals substantially matched to the at least one principal frequency component associated with the at least one MRI audible pulse exceeding a predetermined acoustic power level.

2. The system as in claim 1 wherein the program storage device readable by the system embodies the program of instructions executable by the system to apply audio equalization further comprises a program of instructions executable by the system to apply graphic equalization.

3. The system as in claim 1 wherein the program storage device readable by the system embodies the program of instructions executable by the system to apply audio equalization further comprises a program of instructions executable by the system to apply parametric equalization.

4. The system as in claim 1 wherein the program storage device readable by the system embodies the program of instructions executable by the system to modify the at least one signal dataset further comprises a program of instructions executable by the system to attenuate an overall sound level of the at least one modified data set.

5. The system as in claim 1 wherein the program storage device readable by the system embodies the program of instructions executable by the system further comprises a program of instructions executable by the system to apply dynamic range compression to the at least one modified data set.

6. The system as in claim 1 wherein the program storage device readable by the system embodies the program of instructions executable by the system further comprises a program of instructions executable by the system to apply audio gain to the at least one modified data set, wherein the audio gain is predetermined.

7. The system as in claim 1 further comprising a relational database management system for relationally managing the at least one signal data set.

8. The system as in claim 7 wherein the at least one signal data set comprises a user selectable music library.

9. A method for processing signals to enhance patient audibility of user selected musical signals in an MRI environment generating at least one MRI pulse, the method comprising;
   measuring an acoustic power spectrum of the at least one MRI pulse;
   identifying within the acoustic power spectrum of the at least one MRI pulse at least one principal frequency component and its magnitude;
   applying parametric equalization to the user selected musical signals in accordance with the identified at least one principal frequency component and its magnitude;
   attenuating an overall level of the parametrically equalized user selected musical signals;
   applying dynamic range compression to the parametrically equalized user selected musical signals, and
   applying audio gain to the parametrically equalized user selected musical signals.

10. The method as in claim 9 further comprising:
    storing processed signals; and retrieving processed signals in response to the user selected musical signals.

\* \* \* \* \*